US012469779B2

(12) United States Patent
Kim et al.

(10) Patent No.: US 12,469,779 B2
(45) Date of Patent: Nov. 11, 2025

(54) SEMICONDUCTOR DEVICES HAVING A WIRING PROVIDED WITH A PROTECTIVE LAYER

(71) Applicant: SAMSUNG ELECTRONICS CO., LTD., Suwon-si (KR)

(72) Inventors: Kyounghee Kim, Hwaseong-si (KR); Jinsub Kim, Seoul (KR); Munjun Kim, Suwon-si (KR); Junkwan Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 700 days.

(21) Appl. No.: 17/729,131

(22) Filed: Apr. 26, 2022

(65) Prior Publication Data

US 2023/0067987 A1    Mar. 2, 2023

(30) Foreign Application Priority Data

Aug. 27, 2021 (KR) .................. 10-2021-0114025

(51) Int. Cl.
*H01L 23/522* (2006.01)
*H01L 23/528* (2006.01)
(Continued)

(52) U.S. Cl.
CPC ...... *H01L 23/5226* (2013.01); *H01L 23/5283* (2013.01); *H01L 23/53223* (2013.01);
(Continued)

(58) Field of Classification Search
CPC ............. H01L 23/5226; H01L 23/5283; H01L 23/53223; H01L 23/53238;
(Continued)

(56) References Cited

U.S. PATENT DOCUMENTS 6,465,350 B1    10/2002  Taylor et al.
8,367,542 B2 *   2/2013  Hatanaka .......... H01L 21/28562
                                                       438/785

(Continued)

FOREIGN PATENT DOCUMENTS

JP            3972128           9/2007

*Primary Examiner* — Tan N Tran
(74) *Attorney, Agent, or Firm* — Morgan, Lewis & Bockius LLP

(57) ABSTRACT

A semiconductor device includes: a lower structure including a device and a lower wiring structure; an insulating layer on the lower structure; a via penetrating the insulating layer; a wiring pattern on the insulating layer and the via; and a silicon oxide layer covering the wiring pattern, and including hydrogen, wherein the wiring pattern includes first and second conductive layers, an upper surface protective layer, and a side surface protective layer, wherein the second conductive layer is on the first conductive layer, wherein the upper surface protective layer covers an upper surface of the second conductive layer, and the side surface protective layer covers side surfaces of the first and second conductive layers, and wherein each of the upper surface protective layer and the side surface protective layer includes a metal material having an activation energy higher than that of a metal material of the second conductive layer.

9 Claims, 15 Drawing Sheets

(51) Int. Cl.
*H01L 23/532* (2006.01)
*H10B 12/00* (2023.01)

(52) U.S. Cl.
CPC ..... *H01L 23/53238* (2013.01); *H10B 12/315* (2023.02); *H10B 12/0335* (2023.02); *H10B 12/50* (2023.02)

(58) Field of Classification Search
CPC ....... H01L 2221/1078; H01L 21/76834; H01L 21/76852; H01L 21/76858; H01L 21/7685; H01L 21/76885; H10B 12/315; H10B 12/0335; H10B 12/50; F27D 17/28; H10D 1/716
See application file for complete search history.

(56) References Cited

U.S. PATENT DOCUMENTS

| | | | |
|---|---|---|---|
| 8,471,196 B2 | 6/2013 | Kumano | |
| 8,941,162 B2 * | 1/2015 | Sukekawa | H10B 12/09 |
| | | | 257/306 |
| 10,340,181 B2 | 7/2019 | Yang et al. | |
| 10,566,284 B2 | 2/2020 | Kim et al. | |
| 11,011,469 B2 | 5/2021 | Kim et al. | |
| 11,183,422 B2 * | 11/2021 | Yang | H01L 23/5283 |
| 2006/0151887 A1 * | 7/2006 | Oh | H01L 23/53295 |
| | | | 257/E23.145 |
| 2009/0212397 A1 | 8/2009 | Tuttle | |
| 2010/0163943 A1 | 7/2010 | Ozaki | |
| 2016/0086964 A1 | 3/2016 | Chien et al. | |
| 2020/0035602 A1 | 1/2020 | Nam et al. | |

* cited by examiner

SEMICONDUCTOR DEVICES HAVING A WIRING PROVIDED WITH A PROTECTIVE LAYER

CROSS-REFERENCE TO RELATED APPLICATION

This application claims priority under 35 USC 119(a) to Korean Patent Application No. 10-2021-0114025 filed on Aug. 27, 2021 in the Korean Intellectual Property Office, the disclosure of which is incorporated by reference herein in its entirety.

TECHNICAL FIELD

The present inventive concept relates to a semiconductor device, and more particularly, to a semiconductor device having a wiring provided with a protective layer.

DISCUSSION OF THE RELATED ART

As electronics continue to develop and the desires of users continue to grow, electronic devices are becoming smaller and more powerful in performance. As demand for high performance, high speed, and/or multifunctionality in semiconductor devices increases, a degree of integration of the semiconductor device increases. In accordance with a trend toward increased integration of semiconductor devices, a size of a transistor is being reduced. As described above, a size of wirings electrically connected to the transistor, which has a reduced size, is also being reduced.

SUMMARY

According to an exemplary embodiment of the present inventive concept, a semiconductor device includes: a lower structure including a device and a lower wiring structure; an insulating layer disposed on the lower structure; a via penetrating through the insulating layer; a wiring pattern formed on the insulating layer and the via; and a silicon oxide layer covering the wiring pattern, and including hydrogen, wherein the wiring pattern includes a first conductive layer, a second conductive layer, an upper surface protective layer, and a side surface protective layer, wherein the second conductive layer is disposed on the first conductive layer, wherein the upper surface protective layer covers an upper surface of the second conductive layer, and the side surface protective layer covers a side surface of the first conductive layer and a side surface of the second conductive layer, and wherein each of the upper surface protective layer and the side surface protective layer includes a metal material having an activation energy higher than that of a metal material of the second conductive layer.

According to an exemplary embodiment of the present inventive concept, a semiconductor device includes: a first structure including a device and a first wiring structure; an insulating layer disposed on the first structure; a via penetrating through the insulating layer; a wiring pattern formed on the insulating layer and the via; and a silicon oxide layer disposed the wiring pattern, and including hydrogen, wherein the wiring pattern includes a conductive layer and a protective layer covering at least one of an upper surface or a side surface of the conductive layer, wherein the wiring pattern further includes an interfacial alloy layer disposed between a surface of the conductive layer and the protective layer, and wherein a strength of the interfacial alloy layer is greater than a strength of the conductive layer and a strength of the protective layer.

According to an exemplary embodiment of the present inventive concept, a semiconductor device includes: a lower structure including a device and a lower wiring structure; an insulating layer disposed on the lower structure; a via penetrating through the insulating layer; a wiring pattern formed on the insulating layer and the via; and an oxide layer covering the wiring pattern and formed on the insulating layer, wherein the oxide layer includes hydrogen, wherein the wiring pattern includes a conductive layer and a protective layer covering an upper surface of the conductive layer, wherein the protective layer includes a metal material having an activation energy that is higher than that of a metal material of the conductive layer, and wherein the oxide layer at least partially surrounds a side surface of the conductive layer and an upper surface and a side surface of the protective layer.

BRIEF DESCRIPTION OF DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described with reference to the accompanying drawings.

Figure 1A:
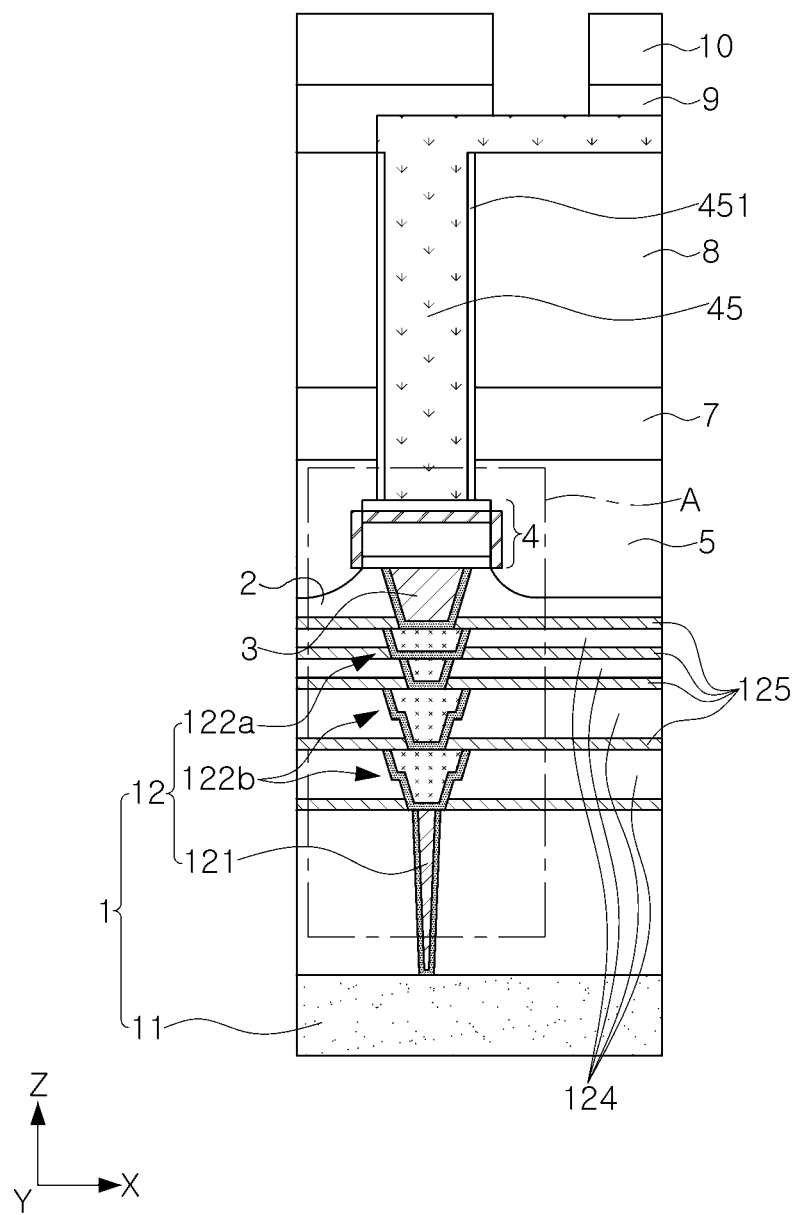
FIGS. 1A and 1B are, respectively, a schematic cross-sectional view and partially enlarged schematic cross-sectional view of a semiconductor device according to an exemplary embodiment of the present inventive concept.
Figure 1B:
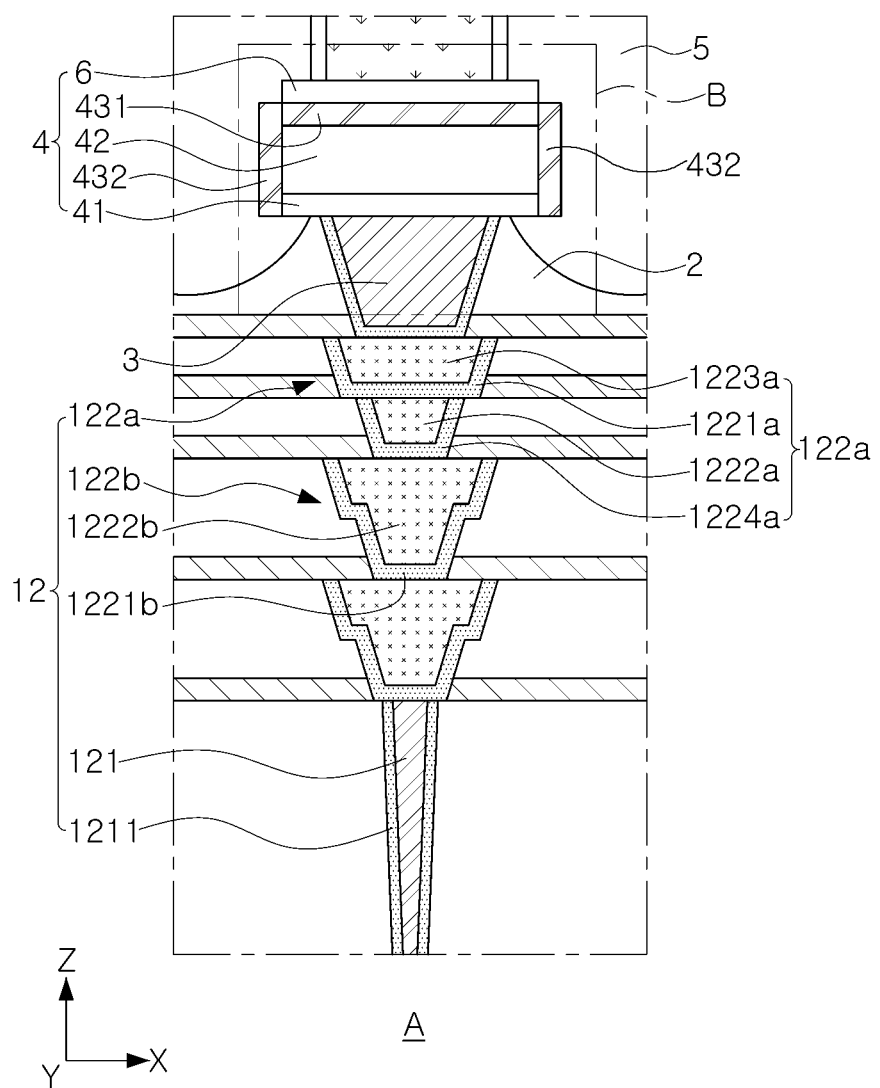

FIGS. 1A and 1B are, respectively, a schematic cross-sectional view and partially enlarged schematic cross-sectional view of a semiconductor device according to an exemplary embodiment of the present inventive concept. FIG. 1A is a schematic cross-sectional view of a semiconductor device according to an exemplary embodiment of the present inventive concept, and FIG. 1B is an enlarged view of region 'A' of FIG. 1A.

Figure 2A:
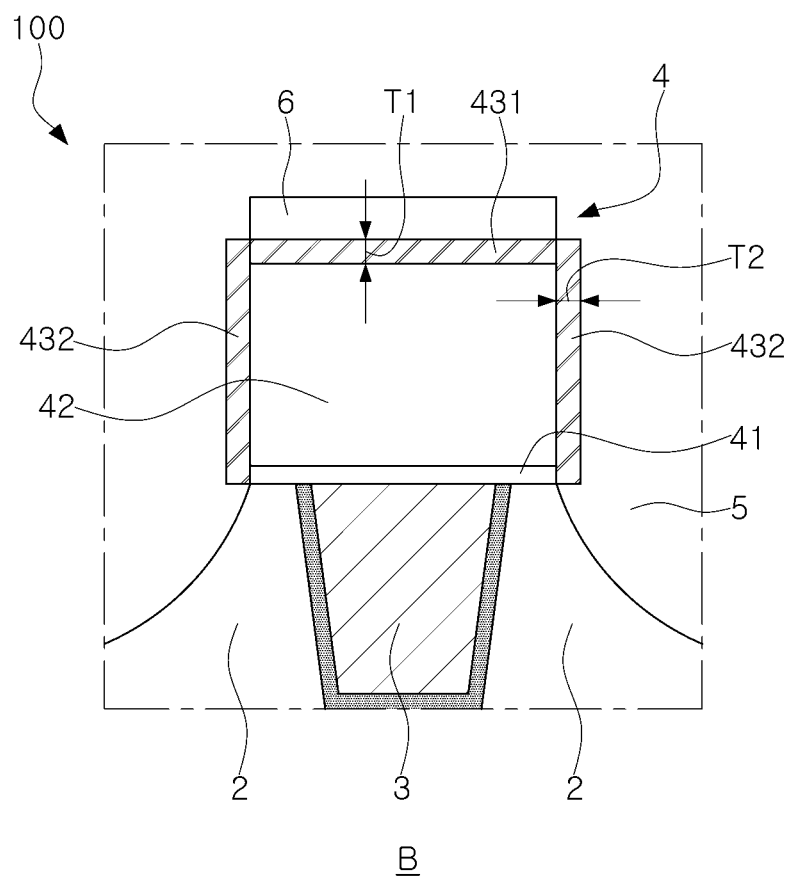
FIGS. 2A and 2B are partially enlarged views of a semiconductor device according to an exemplary embodiment of the present inventive concept.
Figure 2B:
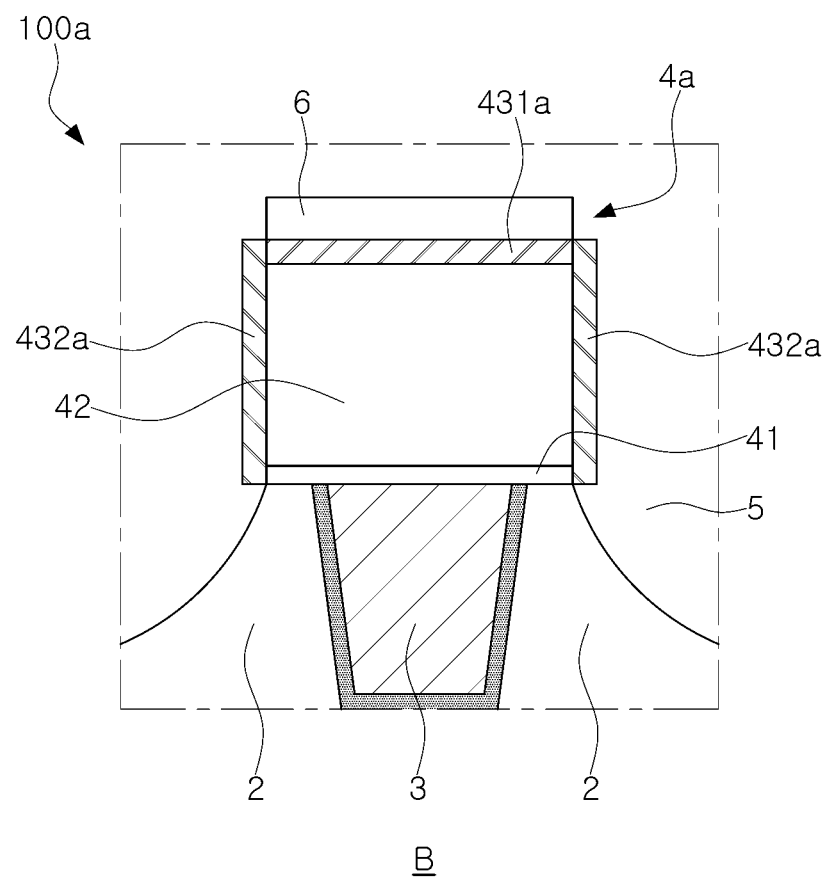

FIGS. 2A and 2B are partially enlarged views of a semiconductor device according to an exemplary embodiment of the present inventive concept. FIGS. 2A and 2B are enlarged views of region 'B' of FIG. 1B.

Referring to FIGS. 1A to 2B, a semiconductor device 100 includes a lower structure 1, a first insulating layer 2, a via 3, a wiring pattern 4, an oxide layer 5, a second insulating layer 7, a third insulating layer 8, a fourth insulating layer 9, and a fifth insulating layer 10. The first insulating layer 2 is on the lower structure 1. The via 3 penetrates through the first insulating layer 2. The wiring pattern 4 is on the first insulating layer 2 and the via 3. The oxide layer 5 covers an upper surface and a side surface of the wiring pattern 4 that is on the first insulating layer 2. For example, the oxide layer 5 may at least partially surround the side surface and the upper surface of the wiring pattern 4. The second insulating layer 7, the third insulating layer 8, the fourth insulating layer 9, and the fifth insulating layer 10 are sequentially stacked on an upper surface of the oxide layer 5.

The lower structure 1 may include a device 11 and a lower wiring structure 12. The device 11 may include a wiring structure used in a memory peripheral circuit region or a cell region of a volatile memory device such as a dynamic random access memory (DRAM) device, a static random access memory (SRAM) device, and the like, or a non-volatile memory device such as a flash memory device, a phase-change random access memory (PRAM) device, a magnetic random access memory (MRAM) device, a resistive random access memory (ReRAM) device, a resistive random access memory (RRAM) device, and the like. In an exemplary embodiment of the present inventive concept, the device 11 may include memory cells and peripheral circuits constituting a dynamic random access memory (DRAM).

The lower wiring structure 12, which is to be described later, may be disposed between the device 11 and a via 3 to electrically connect the device 11 and the via 3 to each other. The lower wiring structure 12 may include an isolation layer 124, an etch stop layer 125, a lower contact plug 121, and lower wirings 122a and 122b. The lower wirings 122a and 122b are disposed on the lower contact plug 121. The lower wirings 122a and 122b may penetrate through the isolation layer 124 and the etch stop layer 125 that are stacked on the device 11. A side surface and a lower surface of the lower contact plug 121 may be covered by a barrier layer 1211.

The lower wiring 122a and 122b may include, for example, at least one of a single damascene copper interconnection 122a and/or a dual damascene copper interconnection 122b, but the present inventive concept is not limited thereto. For example, when the lower wiring 122a and 122b includes a single damascene copper wiring 122a, a wiring gap-fill pattern 1223a and a via gap-fill pattern 1222a may be disposed on separate insulating layers 124. A barrier layer 1221a may cover a side surface and a lower surface of the wiring gap-fill pattern 1223a, and a barrier layer 1224a may cover a side surface and a lower surface of the via gap-fill pattern 1222a. The barrier layer 1221a and the barrier layer 1224a may be disposed as separate layers. For example, when the lower wirings 122a and 122b includes the dual damascene copper wirings 122b, the wirings and vias may be disposed as an integrated gap-fill pattern 1222b, and the integrated gap-fill pattern 1222b may be disposed so that side and lower surfaces thereof are covered with an integrated barrier layer 1221b.

The first insulating layer 2 may be disposed on the lower wiring structure 12. An etch stop layer 125 may be disposed between the first insulating layer 2 and the lower wiring structure 12. The first insulating layer 2 may include an insulating material, for example, a High Density Plasma (HDP) oxide, a Tetraethyl orthosilicate (TEOS) oxide, or the like. After conductive layers 41 and 42 to be described later are stacked on the first insulating layer 2, a portion of the conductive layers 41 and 42 and the first insulating layer 2 may be removed by etching, and a wiring pattern 4 to be described later may be formed. Accordingly, a surface of the first insulating layer 2 may have a downwardly recessed shape. Thereafter, an oxide layer 5 to be described later may be stacked on the first insulating layer 2, to cover an upper surface of the first insulating layer 2 and an upper surface and a side surface of the wiring pattern 4, which are etched. Accordingly, an interface at which the first insulating layer 2 and the oxide layer 5 meet may have a downwardly recessed shape as shown in FIGS. 1A and 1B.

The via 3 may be disposed through the first insulating layer 2 and the etch stop layer 125. The via 3 may be electrically connected to the device 11 of the lower structure 1 by the lower wiring structure 12. The via 3 may include, for example, tungsten (W), aluminum (Al), tantalum (Ta), or the like.

A wiring pattern 4 may be disposed on the first insulating layer 2 and the via 3. Referring to FIGS. 1A and 1B, in an exemplary embodiment of the present inventive concept, the wiring pattern 4 may extend in a Y direction and a Z direction.

The wiring pattern 4 may include one or more conductive layers. For example, the wiring pattern 4 may include a first conductive layer 41 and a second conductive layer 42 disposed on the first conductive layer 41. The wiring pattern 4 may include a protective layer 431 and 432 disposed on at least one of an upper surface and a side surface of the second conductive layer 42. The first conductive layer 41 may be disposed between the via 3 and the second conductive layer 42 to connect the via 3 and the second conductive layer 42 to each other. For example, the oxide layer 5 may at least partially surround a side surface of the first conductive layer 41 and the side surface of the second conductive layer 42.

The wiring pattern 4 includes a protective layer 431 and 432, and the protective layer 431 and 432 may include an upper surface protective layer 431 and a side surface protective layer 432. The upper surface protective layer 431 may be disposed on an upper surface of the second conductive layer 42, and the side surface protective layer 432 may be disposed on a side surface of the second conductive layer 42. In an exemplary embodiment of the present inventive concept, the wiring pattern 4 may include an upper surface protective layer 431 or a side surface protective layer 432. For example, the oxide layer 5 may at least partially surround the upper surface protective layer 431 and the side surface protective layer 432.

The second conductive layer 42 may include, for example, aluminum (Al), titanium (Ti), tungsten (W), cobalt (Co), tantalum (Ta), copper (Cu), or the like. In an exemplary embodiment of the present inventive concept, the second conductive layer 42 may be made of, for example, aluminum (Al). Activation energy of Al is about 0.6 eV, and in particular, activation energy at a surface thereof is about 0.28 eV. Due to relatively low activation energy of Al, during an operation of the semiconductor device, the second conductive layer 42 may be broken due to void formation due to surface metal migration.

In an exemplary embodiment of the present inventive concept, by disposing an upper surface protective layer 431 and a side surface protective layer 432 each made of a metal material having a relatively high activation energy on a surface of the second conductive layer 42, a low surface energy of the second conductive layer 42 may be compensated. Accordingly, an interface between the second conductive layer 42 and an adjacent oxide layer 5 to be described later may be strengthened. Accordingly, electromigration and stress migration may be reduced on a surface of the second conductive layer 42. For example, during diffusion of hydrogen from the oxide layer 5 to the second conductive layer 42, movement of a metal element consisting of the second conductive layer 42 may be suppressed. Accordingly, breakage of the second conductive layer 42 might not occur, and hydrogen diffusion from the oxide layer 5 to the second conductive layer 42 can be performed.

Each of the upper surface protective layer 431 and the side surface protective layer 432 may include a metal material having activation energy higher than that of the second conductive layer 42. For example, the activation energy of the metal material included in the upper surface protective layer 431 and the side surface protective layer 432 may be in a range greater than about 0.6 eV and less than or equal to about 2.96 eV. When the activation energy of the metal material included in the upper surface protective layer 431 and the side surface protective layer 432 is about 0.6 eV or less, the upper surface protective layer 431 and the side surface protective layer 432 cannot prevent electrical movement and stress movement on a surface of the second conductive layer 42, so that it may be difficult to prevent a problem of poor breakage of the second conductive layer 42. When activation energy of a metal material included in the upper surface protective layer 431 and the side surface protective layer 432 exceeds about 2.96 eV, the types of metal elements that can be used as a protective layer are limited, and thus mass productivity may decrease. The activation energy of the metal material included in the upper surface protective layer 431 and the side surface protective layer 432 may be in a range of, for example, about 1.42 eV or more and about 2.06 eV or less.

Each of the upper surface protective layer 431 and the side surface protective layer 432 may include of a single metal element selected from a group including, for example, cobalt (Co), copper (Cu), manganese (Mn), ruthenium (Ru), tantalum (Ta), titanium (Ti), and tungsten (W), or may include two or more metal elements thereof. However, an exemplary embodiment of the present inventive concept is not limited thereto.

Each of the upper surface protective layer 431 and the side surface protective layer 432 may have greater mechanical strength than that of the second conductive layer 42. For example, the mechanical strength of the second conductive layer 42 may be in a range of about 19 kg/mm$^2$ to about 22 kg/mm$^2$, and the mechanical strength of the upper surface protective layer 431 and the side surface protective layer 432 may be in a range of about 81 kg/mm$^2$ to about 143 kg/mm$^2$, respectively, but the present inventive concept is not limited thereto. When the strength of the upper surface protective layer 431 and the side surface protective layer 432 is lower than the above range, the surface strength of the second conductive layer 42 might not be sufficiently increased. When the strength of the upper protective layer 431 and the side protective layer 432 is greater than the above ranges, the types of metal elements that can be used as a protective layer are limited, and thus mass productivity may be lowered.

As shown in FIG. 2A, the upper surface protective layer 431 and the side surface protective layer 432 may be made of the same metal material. For example, the upper surface protective layer 431 and the side surface protective layer 432 may include at least one of cobalt (Co), copper (Cu), manganese (Mn), ruthenium (Ru), tantalum (Ta), titanium (Ti), and/or tungsten (W). For example, each of the upper surface protective layer 431 and the side surface protective layer 432 may be a layer including cobalt (Co).

As shown in FIG. 2B, an upper surface protective layer 431a and a side surface protective layer 432a may be made of different metal materials form each other. For example, the upper surface protective layer 431a may be a layer including titanium (Ti), and the side surface protective layer 432a may be a layer including cobalt (Co).

A thickness T1 of the upper surface protective layer 431 and a thickness T2 of the side surface protective layer 432 may be the same as or different from each other. For example, the thickness T1 of the upper surface protective layer 431 and the thickness T2 of the side surface protective layer 432 may be in a range of about 100 Å to about 300 Å, respectively, but an exemplary embodiment thereof is not limited thereto. When the thickness T1 of the upper surface protective layer 431 and the thickness T2 of the side surface protective layer 432 are smaller than the above range, an effect of increasing surface activation energy and strength of the second conductive layer 42 might not be sufficient. When the thickness T1 of the upper surface protective layer 431 and the thickness T2 of the side surface protective layer 432 are greater than the above range, it may be difficult to refine the wiring, and the efficiency of the process may be impaired.

The thickness T1 of the upper surface protective layer 431 and the thickness 12 of the side surface protective layer 432 may be determined in consideration of the thickness of the second conductive layer 42, and the like. The thickness T1 of the upper surface protective layer 431 and the thickness T2 of the side surface protective layer 432 may be substantially uniform over the second conductive 42, or may have a deviation. For example, the thicknesses at both ends of the upper surface protective layer 431 and the side surface protective layer 432 may be thinner than the thickness in a central portion of the upper surface protective layer 431 and the side surface protective layer 432, but the present inventive concept is not limited thereto. In an exemplary embodiment of the present inventive concept, the thicknesses of the second conductive layer 42, the upper surface protective layer 431, and the side surface protective layer 432 may be variously changed and might not uniform.

The wiring pattern 4 may further include an antireflective layer 6. The antireflective layer 6 may cover a portion or all of the upper surface of the upper surface protective layer 431. The antireflective layer 6 may include a material having lower reflectance than that of the second conductive layer 42, for example, a material having higher light absorption. The antireflective layer 6 may be, for example, an oxide layer or a nitride layer of the second conductive layer 42. For example, the antireflective layer 6 may include TiN, TiO$_2$, TaN, Ta$_2$O$_5$, and/or the like.

The oxide layer 5 may be disposed on the first insulating layer 2 and may cover an upper surface and a side surface of the wiring pattern 4. For example, the oxide layer 5 may include hydrogen, for example, a silicon oxide layer including hydrogen. The oxide layer 5 may include, for example, a high density plasma (HDP) oxide, a Tetraethyl Orthosilicate (TEOS) oxide, or the like. The oxide layer 5 can supply hydrogen to the wiring pattern 4 when heat is applied thereto. Heat treatment may be performed, for example, at about 400° C. for about 120 minutes, but the present inventive concept is not limited thereto. Hydrogen may diffuse through the wiring pattern 4, the via 3, and the lower wiring structure 12, to be supplied to a transistor of the device 11. Hydrogen supplied from the oxide layer 5 may be supplied to a source/drain region or a gate of the transistor. By the hydrogen being supplied from the oxide layer 5, unstable lattice bonds existing on a surface of the gate of the transistor of the lower structure 1 can be reduced to stable bonding. The oxide layer 5 may be formed by, for example, High Density Plasma Chemical Vapor Deposition (HDP-CVD). An interface between the oxide layer 5 and the first insulating layer 2 may be substantially flat or may be recessed downwardly by etching.

The second insulating layer 7, the third insulating layer 8, the fourth insulating layer 9, and the fifth insulating layer 10 may be sequentially stacked on the oxide layer 5. In addition, an upper wiring 45 may be disposed on the wiring pattern 4 and may penetrate the second insulating layer 7, the third insulating layer 8, and the fourth insulating layer 9. A barrier layer 451 may be included between the upper wiring 45 and the second insulating layer 7 and between the upper wiring 45 and the third insulating layer 8.

FIGS. 3A to 7B are partially enlarged views of semiconductor devices according to exemplary embodiments of the present inventive concept. In FIGS. 3A to 7B, the same reference numerals as those of FIGS. 1A to 2B indicate corresponding components, and a description overlapping with the above description will be omitted.

Figure 3A:
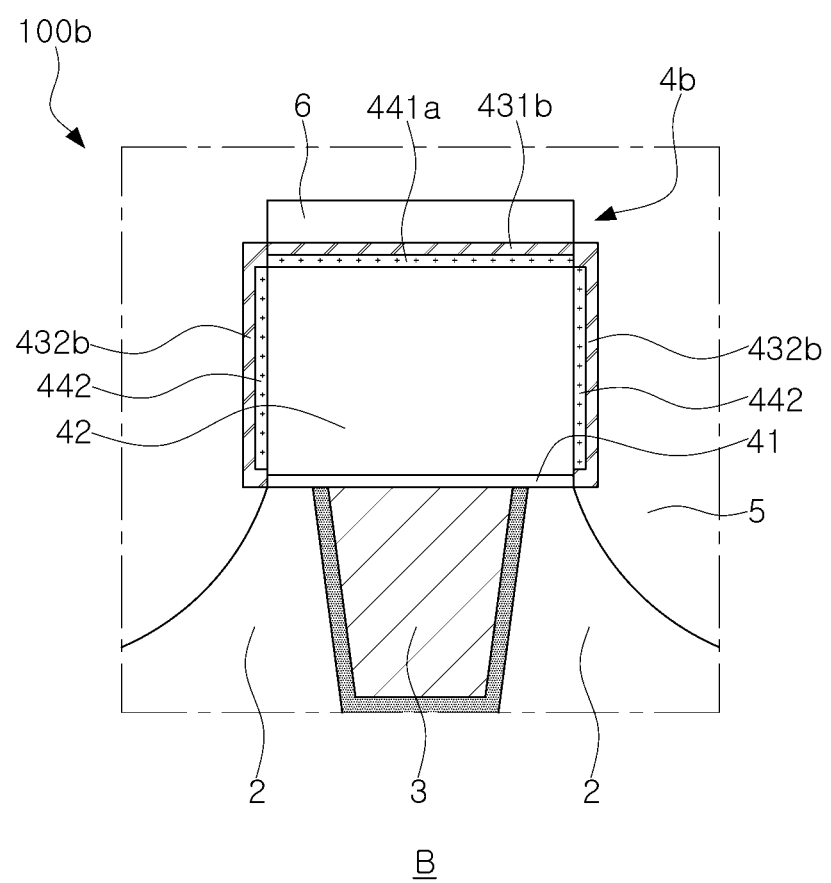
FIGS. 3A and 3B are partially enlarged views of a semiconductor device according to an exemplary embodiment of the present inventive concept.

Referring to FIG. 3A, compared to the exemplary embodiment of FIG. 2A, a wiring pattern 4b may further include an upper interfacial alloy layer 441a between an upper surface of a second conductive layer 42 and an upper surface protective layer 431b. The wiring pattern 4b may further include a side interfacial alloy layer 442 between a side surface of the second conductive layer 42 and a side surface protective layer 432b. The upper interfacial alloy layer 441 may include at least one of the metal elements included in the second conductive layer 42 and the upper surface protective layer 431b. The side interfacial alloy layer 442 may include at least one of the metal elements included in the second conductive layer 42 and the side surface protective layer 432b.

The upper surface protective layer 431b and the side surface protective layer 432b may be made of the same metal material as each other, and the upper interfacial alloy layer 441 and the side interfacial alloy layer 442 may be made of the same metal material as each other. For example, the second conductive layer 42 may be an Al conductive layer. For example, each of the upper surface protective layer 431b and the side surface protective layer 432b may be a Ti layer, and each of the upper interfacial alloy layer 441 and the side interfacial alloy layer 442 may be a TiAl$_3$ layer.

Activation energy of a metal constituting the upper interfacial alloy layer 441a may be higher than activation energy of a metal constituting the second conductive layer 42 and the upper surface protective layer 431b. Activation energy of a metal constituting the side interfacial alloy layer 442 may be higher than activation energy of a metal constituting the second conductive layer 42 and the side surface protective layer 432b.

Mechanical strength of the upper interfacial alloy layer 441a may be greater than mechanical strength of the second conductive layer 42 and the upper surface protective layer 431b. Mechanical strength of the side interfacial alloy layer 442 may be greater than mechanical strength of the second conductive layer 42 and the side surface protective layer 432b. For example, the mechanical strength of the second conductive layer 42 may be in a range of about 19 kg/mm$^2$ to about 22 kg/mm$^2$, and the mechanical strength of the upper surface protective layer 431b and the side surface protective layer 432b may be in a range of about 81 kg/mm$^2$ to about 143 kg/mm$^2$. For example, the mechanical strength of the upper interfacial alloy layer 441a and the side interfacial alloy layer 442 may be in a range of about 660 kg/mm$^2$ to about 750 kg/mm$^2$, but present inventive concept is not limited thereto. When the mechanical strength of the protective layers 431b and 432b is less than the above corresponding range and the mechanical strength of the interfacial alloy layers 441a and 442 is less than the above corresponding range, surface strength of the second conductive layer 42 might not be sufficiently increased. When the strength of the protective layers 431b and 432b is greater than the above corresponding range and the strength of the interfacial alloy layers 441 and 442 is greater than the above corresponding range, the types of metal elements that can be used as a protective layer may be excessively limited.

Figure 3B:
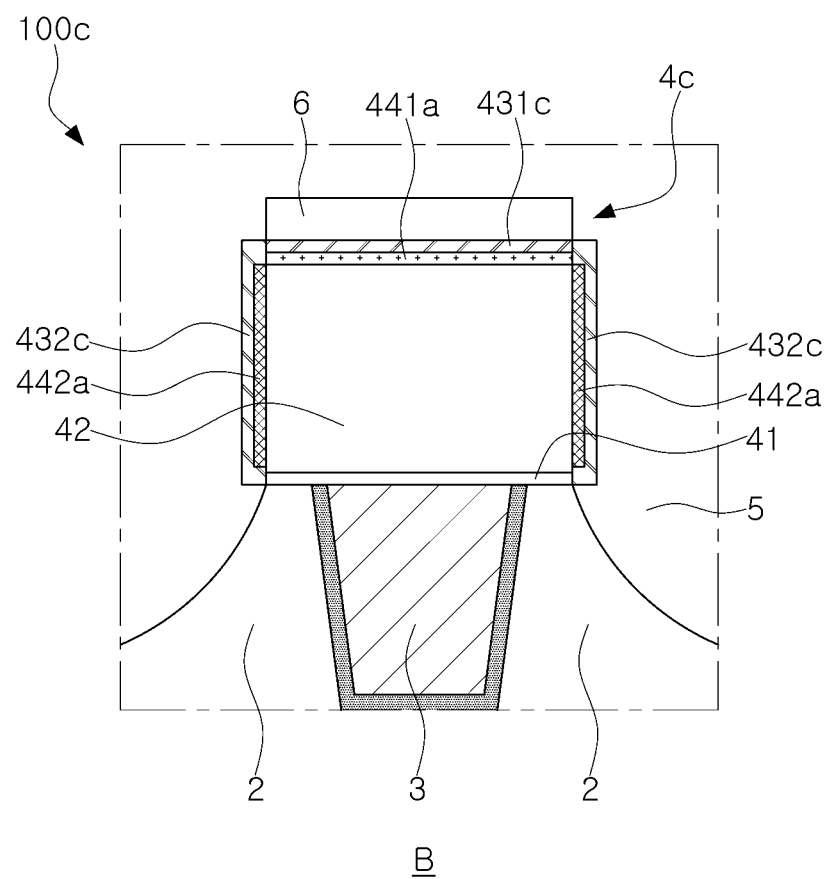

Referring to FIG. 3B, a wiring pattern 4c may further include an upper interfacial alloy layer 441a and a side interfacial alloy layer 442a. The upper interfacial alloy layer 441 may be disposed between an upper surface of the second conductive layer 42 and an upper surface protective layer 431c, and the side interfacial alloy layer 442a may be disposed between a side surface of the second conductive layer 42 and a side surface protective layer 432c.

Compared with the exemplary embodiment of FIG. 3A, the upper protective layer 431c and the side protective layer 432c may be made of different metal materials from each other, and the upper interfacial alloy layer 441a and the side interfacial alloy layer 442a may include different metal materials from each other.

Relative magnitudes of the activation energies of the upper surface protective layer 431c and the side surface protective layer 432c and relative magnitudes of the activation energies of the upper interfacial alloy layer 441a and the side interfacial alloy layer 442a may be the same as or different from each other. In an exemplary embodiment of the present inventive concept, the relative magnitudes of the activation energies of the upper surface protective layer 431c and the side surface protective layer 432c may be the same as or different from each other. In an exemplary embodiment of the present inventive concept, the relative magnitudes of the activation energies of the upper interfacial alloy layer 441a and the side interfacial alloy layer 442a may be the same as or different from each other.

The relative magnitudes of the strengths of the upper surface protective layer 431c and the side surface protection layer 432c and the relative magnitudes of the strengths of the upper interfacial alloy layer 441a and the side interfacial alloy layer 442a may be the same as or different from each other.

Figure 4:
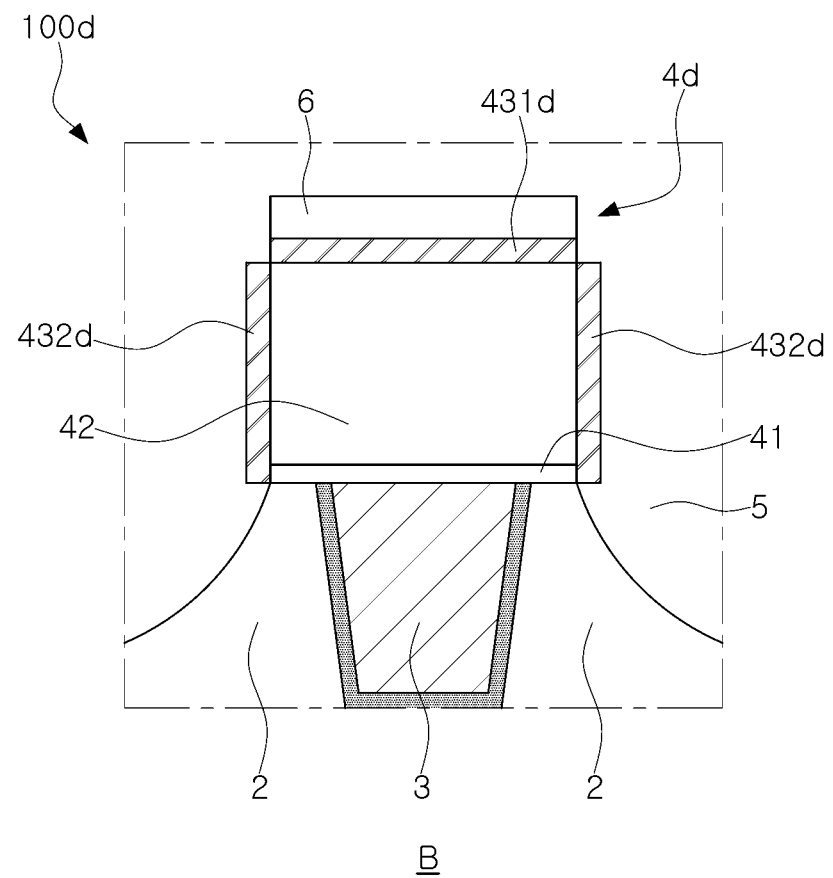
FIG. 4 is a partially enlarged view of a semiconductor device according to an exemplary embodiment of the present inventive concept.

Referring to FIG. 4, a wiring pattern 4d includes a side surface protective layer 432d disposed on a side surface of the second conductive layer 42. Unlike in the exemplary embodiments of FIGS. 2A to 3B, the side surface protective layer 432d might not be continuous with an upper protective layer 431d. For example, the side surface protective layer 432d might not extend beyond the upper surface of the second conductive layer 42 such that an end of the side surface protective layer 432d is coplanar with an upper surface of the upper protective layer 431d. The side surface protective layer 432d might not cover a side surface of the upper surface protective layer 431d, or may cover only a portion of the side surface of the upper surface protective layer 431d.

Figure 5:
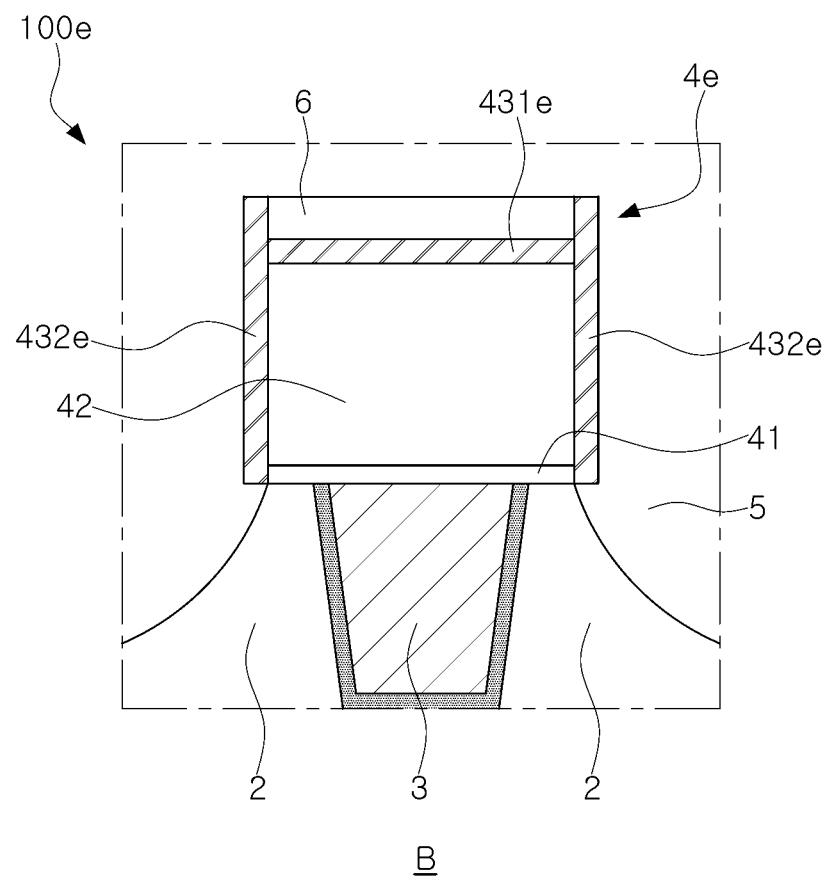
FIG. 5 is a partially enlarged view of a semiconductor device according to an exemplary embodiment of the present inventive concept.

Referring to FIG. 5, a wiring pattern 4e includes a side surface protective layer 432e disposed on a side surface of the second conductive layer 42. Unlike in the exemplary embodiments of FIGS. 2A to 3B and the exemplary embodiment of FIG. 4, the side surface protective layer 432e may extend to cover a side surface of an antireflective layer 6 that is disposed on an upper surface of the upper surface protective layer 431e. The side surface protective layer 432e may cover a portion or all of the side surface of the antireflective layer 6.

Figure 6A:
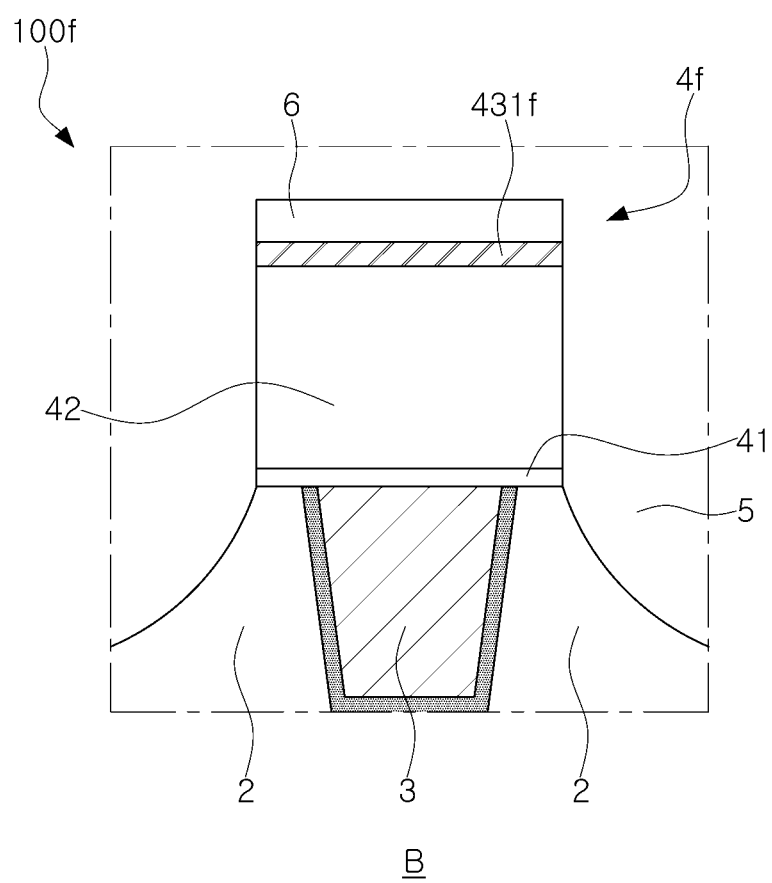
FIGS. 6A and 6B are partially enlarged views of a semiconductor device according to an exemplary embodiment of the present inventive concept.

Referring to FIG. 6A, a semiconductor device 100f may include a via 3, an insulating layer 2, a first conductive layer 41, a second conductive layer 42, and an upper surface protective layer 431f. The insulating layer 2 may surround a side surface of the via 3, and the first conductive layer 41 may be disposed on the insulating layer 2 and the via 3. The second conductive layer 42 may be disposed on the first conductive layer 41, and the upper surface protective layer 431f may be disposed on the second conductive layer 42. In the present embodiment, unlike in the exemplary embodiments of FIGS. 2A to 5, a wiring pattern 4f includes an upper surface protective layer 431f disposed on an upper surface of the second conductive layer 42, and does not include a protective layer on a side surface thereof. The upper surface protective layer 431f may include a metal material having an activation energy that is higher than that of a metal material forming the second conductive layer 42. The upper surface protective layer 431f may have a mechanical strength that is greater than the that of the second conductive layer 42.

Figure 6B:
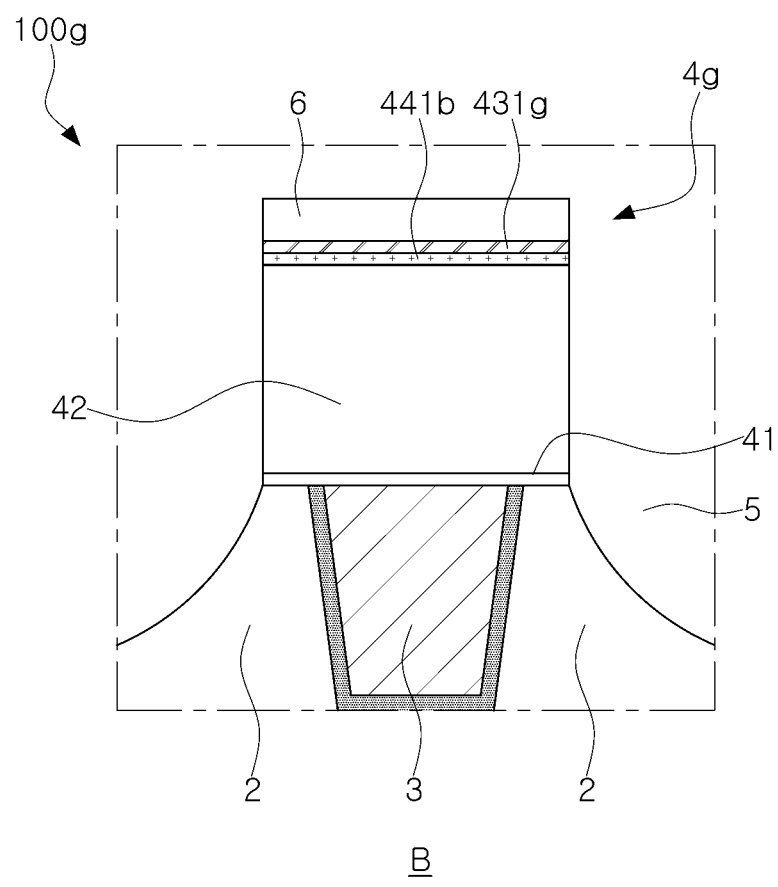

Referring to FIG. 6B, a wiring pattern 4g further includes an upper interfacial alloy layer 441b disposed between the second conductive layer 42 and an upper surface protective layer 431g that covers an upper surface of the second conductive layer 42. The upper interfacial alloy layer 431g may include a metal material having an activation energy that is higher than that of a metal material forming the upper surface protective layer 431g and the second conductive layer 42. The upper interfacial alloy layer 441b may have a mechanical strength that is greater than that of the upper surface protective layer 431g and the second conductive layer 42.

Figure 7A:
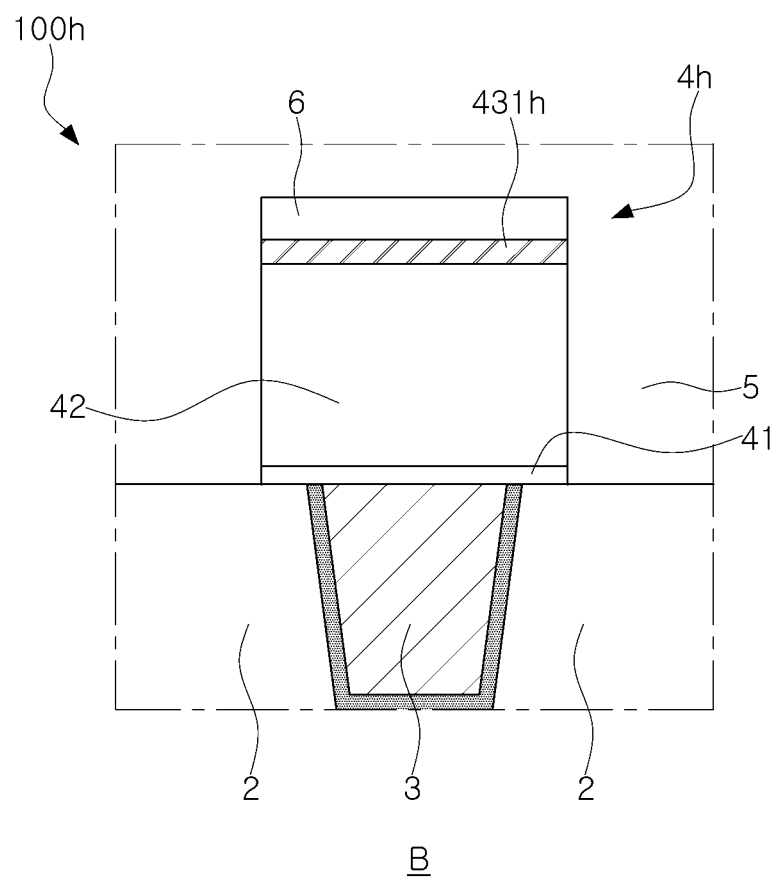
FIGS. 7A and 7B are partially enlarged views of a semiconductor device according to an exemplary embodiment of the present inventive concept.
Figure 7B:
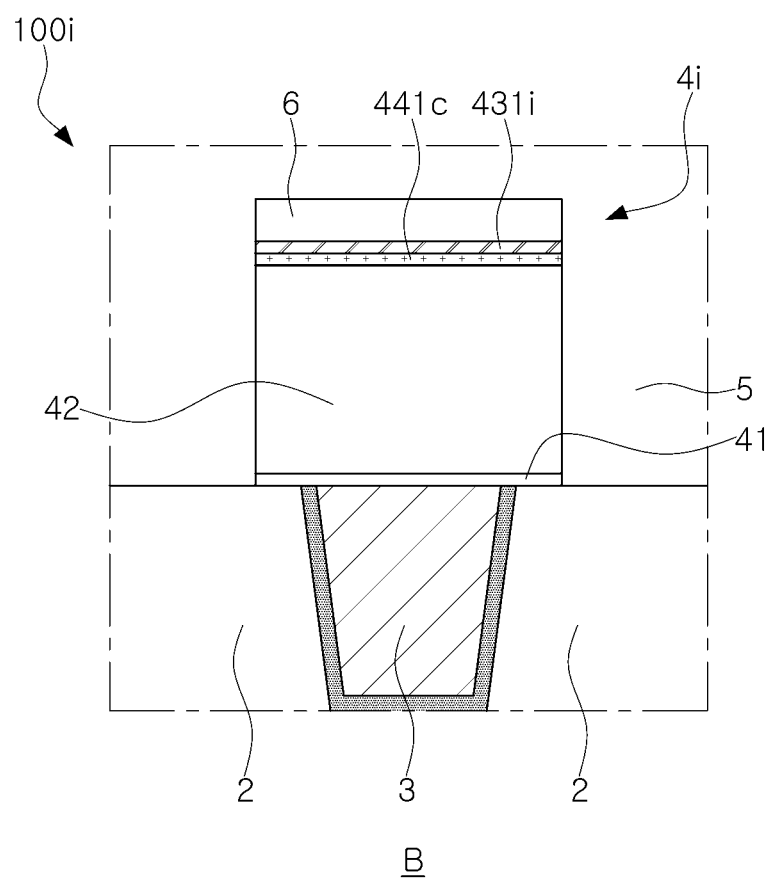

A semiconductor device 100h of FIG. 7A is different from the semiconductor device 100f of FIG. 6A in that an interface between the first insulating layer 2 and the oxide layer 5 has a flat shape at a boundary at which the first insulating layer 2 and the oxide layer 5 contact each other. A semiconductor device 100i of FIG. 7B is different from the semiconductor device 100g of FIG. 6B in that an interface between the first insulating layer 2 and the oxide layer 5 has a flat shape at the boundary at which the first insulating layer 2 and the oxide layer 5 contact each other.

In the present embodiment, the upper surface protective layer 431f may be disposed on an upper surface of the second conductive layer 42, and a protective layer might not be disposed on a side surface of the second conductive layer 42; however, the present inventive concept is not limited thereto. For example, a protective layer may be disposed on a side surface of the second conductive layer 42.

Figure 8:
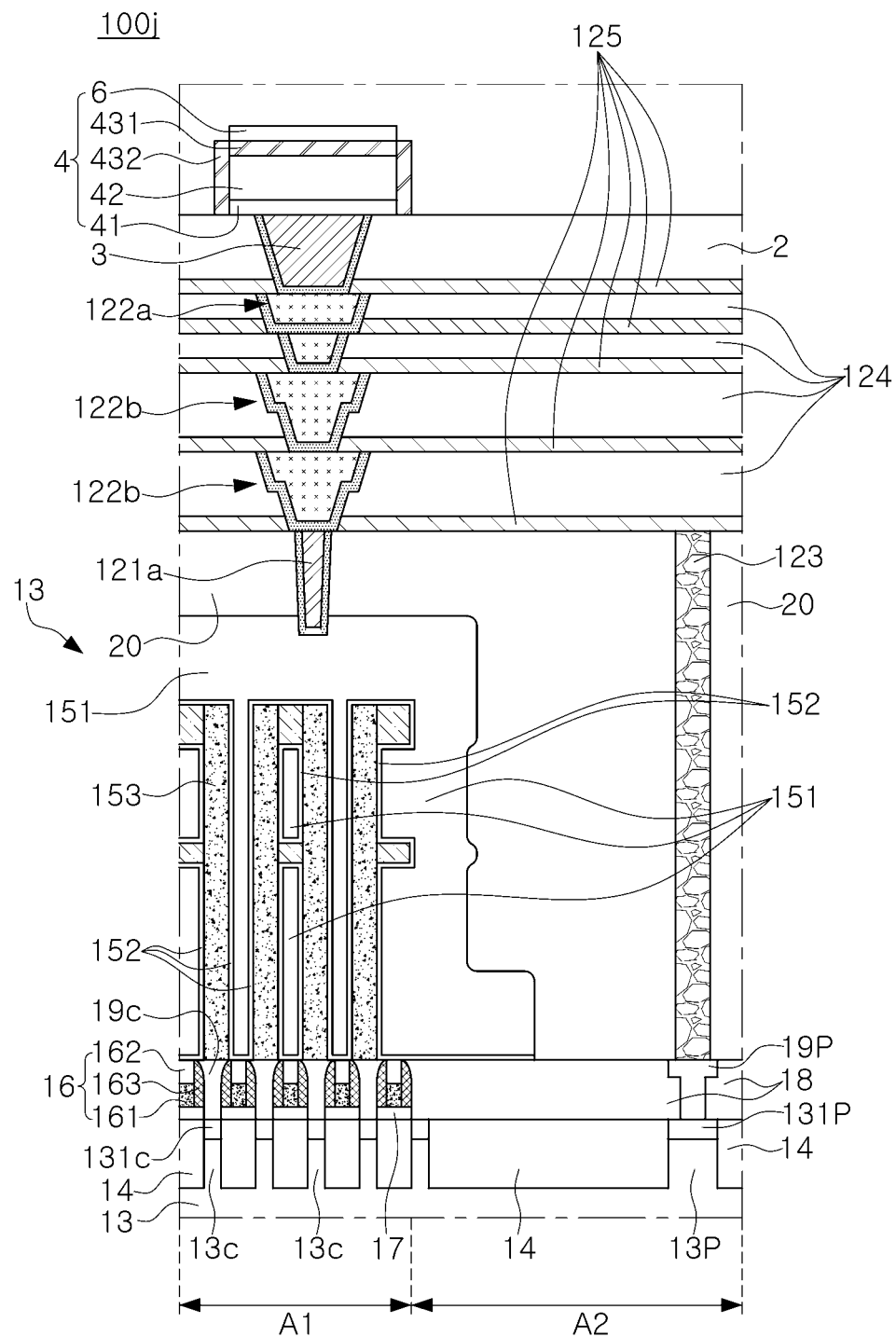
FIG. 8 is a schematic cross-sectional view of a semiconductor device according to an exemplary embodiment of the present inventive concept.

FIG. 8 is a schematic cross-sectional view of a semiconductor device according to an exemplary embodiment of the present inventive concept.

Referring to FIG. 8, a device 11 may include a substrate 13 including a first region A1 and a second region A2. An isolation region 14 defining cell active regions 13c and a peripheral active region 13p may be disposed on the substrate 13.

Bit line structures 16 may be disposed on the first region A1 of the substrate 13. The bit line structures 16 may be disposed by sequentially stacking bit lines 161 and a bit line capping layer 162 on the isolation region 14. In addition, bit line spacers 163 may be disposed on side surfaces of the bit lines 161 and the bit line capping layer 162, which are sequentially stacked on the isolation region 14. The bit lines 161 may be formed of a conductive material.

The bit lines 161 may be disposed on a lower insulating layer 17 that is disposed on the substrate 13. The bit line capping layer 162 may be formed of an insulating material such as a silicon nitride, or the like. The bit line spacers 163 may be formed of an insulating material such as a silicon nitride, or the like.

An interlayer insulating layer 18 may be disposed on the second region A2 of the substrate 13. The interlayer insulating layer 18 may be formed of a silicon oxide. Cell contact plugs 19c may be disposed between adjacent bit line structures 16, and may be electrically connected to cell impurity regions 131c in the cell active regions 13c. A peripheral contact plug 19p may be electrically connected to the peripheral impurity region 131p in the peripheral active region 13p, and may penetrate the interlayer insulating layer 18.

The cell impurity regions 131c may be any one of a source or a drain of a cell switching device disposed in the first region A1. The peripheral impurity region 131p may be a source/drain of a peripheral transistor disposed in the second region A2.

A capacitor may be disposed on the substrate 13. The capacitor may include an upper electrode 151, a dielectric layer 152, and a lower electrode 153.

The dielectric layer 152 may include a high-k dielectric material, a silicon oxide, a silicon nitride, a silicon oxynitride, or a combination thereof. The upper electrode 151 may include a conductive material such as a metal, a metal nitride, conductive carbon, a conductive semiconductor alloy, or a combination thereof. The semiconductor compound may include, for example, a doped SiGe material.

The upper electrode 151, the dielectric layer 152, and the lower electrode 153 may constitute DRAM cell capacitors capable of storing information in a memory cell array such as a DRAM.

A planarized intermetallic insulating layer 20 may be disposed on the substrate 13 on which an upper electrode 151 is disposed. A lower contact plug 121a may penetrate through the intermetallic insulating layer 20 and may be electrically connected to the upper electrode 151. In addition, the peripheral contact structure 123 may be disposed to penetrate through the intermetallic insulating layer 20 and may be electrically connected to the peripheral contact plug 19p.

FIGS. 9A to 9F are schematic cross-sectional views illustrating a method of manufacturing a semiconductor device according to an exemplary embodiment of the present inventive concept.

Figure 9A:
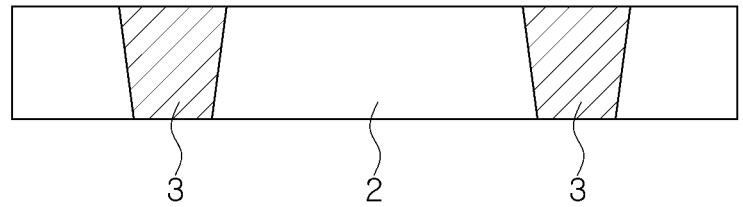
FIGS. 9A, 9B, 9C, 9D, 9E, and 9F are schematic cross-sectional views illustrating a method of manufacturing a semiconductor device according to an exemplary embodiment of the present inventive concept.

Referring to FIG. 9A, a via 3 penetrating through a first insulating layer 2 on a lower structure may be formed. After the via 3 is formed, a surface of the via 3 and the first insulating layer 2 may be planarized by chemical mechanical polishing (CMP). For example, an upper surface of the first insulating layer 2 and an upper surface of the via 3 may be coplanar.

Figure 9B:
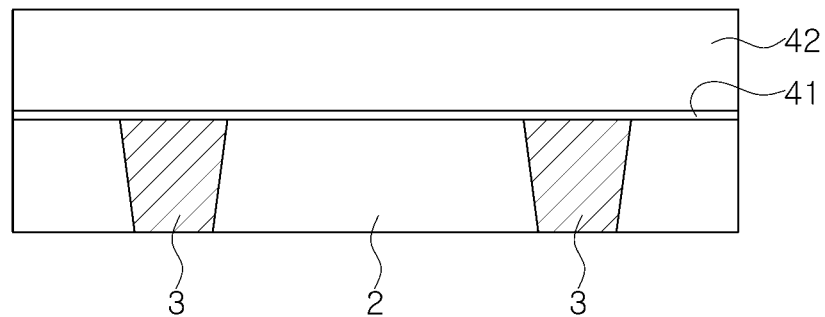

Referring to FIG. 9B, a conductive layer is stacked on the planarized surfaces of the via 3 and the first insulating layer 2. The conductive layer may be composed of a single layer, or may be composed of two or more layers. In an exemplary embodiment of the present inventive concept, the conductive layer may include a first conductive layer 41 and a second conductive layer 42.

Figure 9C:
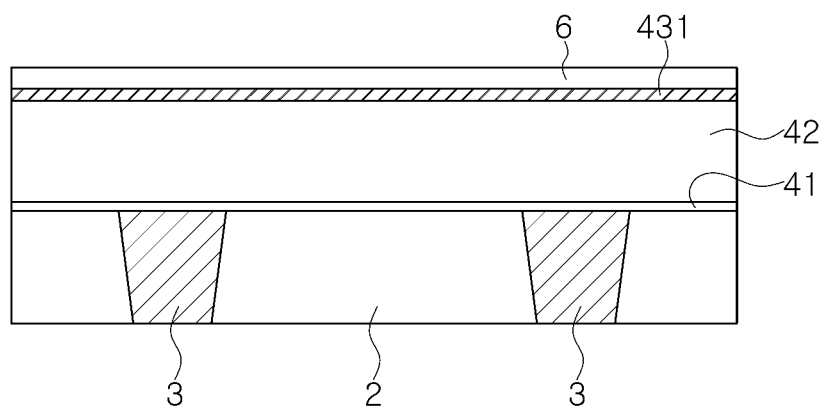

Referring to FIG. 9C, an upper surface protective layer 431 may be stacked on the second conductive layer 42. The upper surface protective layer 431 may cover a portion of an upper surface of the second conductive layer 42 or cover the entire upper surface of the second conductive layer 42. An antireflective layer 6 may be stacked on the upper surface protective layer 431. The antireflective layer 6 may be omitted, if necessary.

Figure 9D:
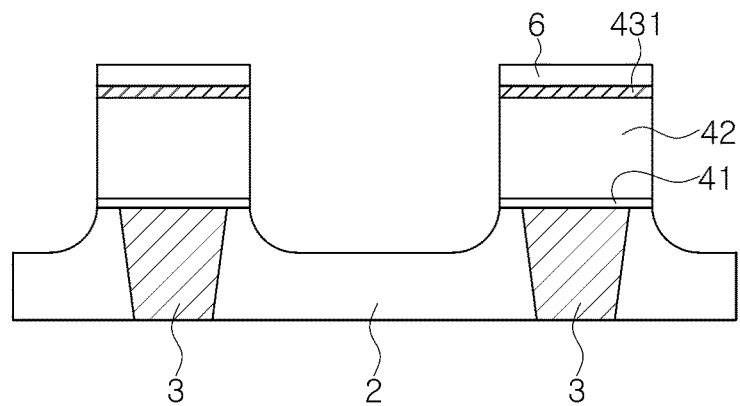

Referring to FIG. 9D, a portion of a laminate of the first conductive layer 41, the second conductive layer 42, the upper surface protective layer 431, and the antireflective layer 6 may be removed by etching, such that a wiring pattern may be patterned. In addition, a portion of the first insulating layer 2 may also be etched. The etched surface of the first insulating layer 2 may have a downwardly recessed shape as shown in FIGS. 2A to 6B, or have a flat shape as shown in FIGS. 7A and 7B. For example, the first insulating layer 2 may have an indentation therein.

Figure 9E:
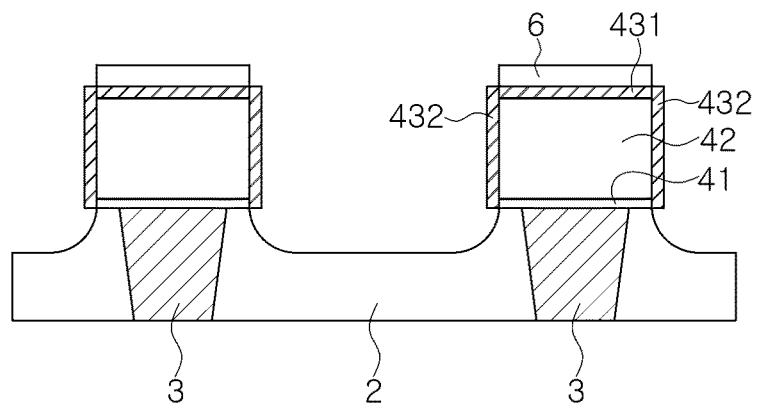

Referring to FIG. 9E, a side surface protective layer 432 may be disposed on side surfaces of the second conductive layer 42 and the first conductive layer 41 such that the side surfaces of the second conductive layer 42 and the first conductive layer 41 may be covered. The side surface protective layer 432 may be disposed to cover the side surfaces of the first conductive layer 41, the second conductive layer 42, and the upper surface protective layer 431, so that the wiring pattern of FIGS. 2A and 2B may be formed. In addition, the side surface protective layer 432 may be disposed to cover the side surfaces of the first conductive layer 41 and the second conductive layer 42. In addition, the side surface protective layer 432 may be disposed to cover the side surfaces of the first conductive layer 41, the second conductive layer 42, the upper surface protective layer 431, and the antireflective layer 6, so that the wiring pattern of FIG. 5 may be formed.

The side surface protective layer 432 may be formed by a method of depositing metal on a metal layer by using selective metal for metal deposition. Accordingly, it is possible to easily form a protective film on a metal wiring other than a damascene structure.

In an exemplary embodiment of the present inventive concept, a process of forming the side surface protective layer 432 in FIG. 9E may be omitted. In this case, only an upper surface protective layer 431 covering an upper surface of the second conductive layer 42 is formed, and the side surface protective layer 432 is not formed. Accordingly, semiconductor devices of FIGS. 6A to 7B may be manufactured.

Figure 9F:
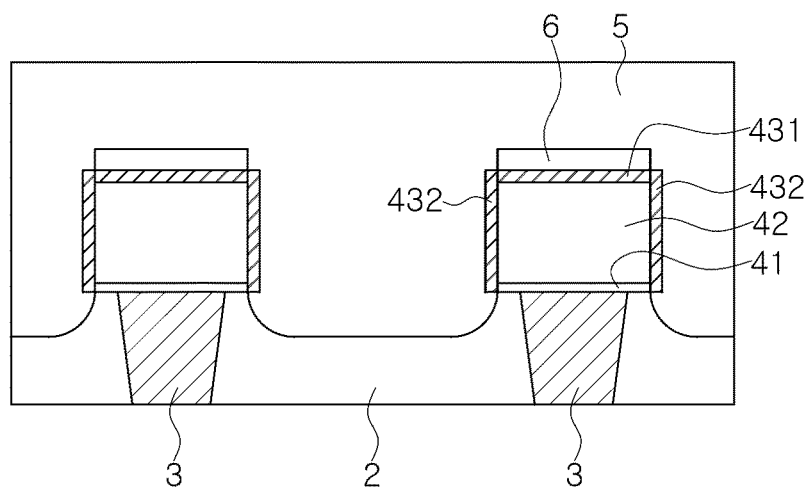

Referring to FIG. 9F, an oxide layer 5 may be formed on the first insulating layer 2 to cover the first conductive layer 41, the second conductive layer 42, the upper surface protective layer 431, and the antireflective layer 6. The oxide layer 5 may include a large amount of hydrogen, and may be, for example, a silicon oxide layer. For example, the oxide layer 5 may be formed by high density plasma chemical vapor deposition (HDP-CVD). A deposition temperature may range from about 280° C. to about 340° C., but the present inventive concept is not limited thereto.

After the oxide layer 5 is formed, if heat treatment is applied to a semiconductor device, hydrogen in the oxide layer 5 may be diffused toward a gate of a transistor through wiring patterns, vias, and lower wirings. Thereby, a leakage current caused by an unstable silicon lattice bonding state present in a device transistor may be prevented.

As set forth above, according to the present inventive concept, by including a wiring having a protective layer, a semiconductor device having increased reliability may be provided.

The various effects of the present inventive concept are not limited to the above description, and may be more easily understood in the course of describing the exemplary embodiments of the present inventive concept.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A semiconductor device, comprising:
  a lower structure including a device and a lower wiring structure;
  an insulating layer disposed on the lower structure;
  a via penetrating through the insulating layer;
  a wiring pattern formed on the insulating layer and the via; and
  a silicon oxide layer covering the wiring pattern, and including hydrogen,
  wherein the wiring pattern includes a first conductive layer, a second conductive layer, an upper surface protective layer, and a side surface protective layer, wherein the second conductive layer is disposed on the first conductive layer, wherein the upper surface protective layer covers an upper surface of the second conductive layer, and the side surface protective layer covers a side surface of the first conductive layer and a side surface of the second conductive layer,
  wherein each of the upper surface protective layer and the side surface protective layer includes a metal material having an activation energy higher than that of a metal material of the second conductive layer, and
  wherein the wiring pattern further comprises an upper interfacial alloy layer disposed between the upper surface of the second conductive layer and the upper surface protective layer; and
  a side interfacial alloy layer disposed between the side surface of the second conductive layer and the side surface protective layer;
  a side interfacial alloy layer disposed between the side surface of the second conductive layer and the side surface protective layer.

2. The semiconductor device of claim 1, wherein the upper interfacial alloy layer and the side interfacial alloy layer comprise different materials from each other.

3. The semiconductor device of claim 1, wherein each of the upper interfacial alloy layer and the side interfacial alloy layer comprises a metal material having an activation energy higher than that of the metal material of the second conductive layer.

4. A semiconductor device, comprising:
  a first structure including a device and a first wiring structure;
  an insulating layer disposed on the first structure;
  a via penetrating through the insulating layer;
  a wiring pattern formed on the insulating layer and the via; and a silicon oxide layer disposed on the wiring pattern, and including hydrogen, wherein the wiring pattern includes a conductive layer and a protective layer covering at least one of an upper surface or a side surface of the conductive layer, wherein the wiring pattern further includes an interfacial alloy layer disposed between a surface of the conductive layer and the protective layer, and wherein a strength of the interfacial alloy layer is greater than a strength of the conductive layer and a strength of the protective layer.

5. The semiconductor device of claim 4, wherein the strength of the interfacial alloy layer is greater than the strength of the protective layer, and wherein the strength of the protective layer is greater than the strength of the conductive layer.

6. The semiconductor device of claim 4, wherein the conductive layer comprises Al, wherein the protective layer comprises Ti, and wherein the interfacial alloy layer comprises TiAl3.

7. The semiconductor device of claim 6, wherein the strength of the conductive layer ranges from about 19 kg/mm$^2$ to about 22 kg/mm$^2$, wherein the strength of the protective layer ranges from about 81 kg/mm$^2$ to about 143 kg/mm$^2$, and wherein the strength of the interfacial alloy layer ranges from about 660 kg/mm$^2$ to about 750 kg/mm$^2$.

8. The semiconductor device of claim 4, wherein the protective layer completely covers the upper surface of the conductive layer.

9. The semiconductor device of claim 8, wherein the interfacial alloy layer completely covers the upper surface of the conductive layer.

* * * * *